US009832567B2

(12) United States Patent
Zhang et al.

(10) Patent No.: US 9,832,567 B2
(45) Date of Patent: Nov. 28, 2017

(54) ACOUSTIC PORT WITH AN EMBEDDED MEMBRANE

(71) Applicant: Apple Inc., Cupertino, CA (US)

(72) Inventors: Yaocheng Zhang, Cupertino, CA (US); Benjamin J. Pope, Mountain View, CA (US); Teodor Dabov, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/266,892

(22) Filed: Sep. 15, 2016

(65) Prior Publication Data

US 2017/0201826 A1    Jul. 13, 2017

Related U.S. Application Data

(60) Provisional application No. 62/277,454, filed on Jan. 11, 2016.

(51) Int. Cl.
| | |
|---|---|
| *H05K 5/00* | (2006.01) |
| *H04R 1/44* | (2006.01) |
| *H05K 5/02* | (2006.01) |
| *H04R 1/02* | (2006.01) |

(52) U.S. Cl.
CPC ............... *H04R 1/44* (2013.01); *H04R 1/023* (2013.01); *H05K 5/0213* (2013.01); *H05K 5/0217* (2013.01); *H04R 2499/11* (2013.01)

(58) Field of Classification Search
CPC .......... H05K 5/00; H05K 5/02; H05K 5/0217; H05K 5/0221; H05K 5/03; H05K 5/061; H05K 5/0213; H02G 3/08; H02G 3/081; H02G 3/088; F16J 15/00; F16J 15/02; F16J 15/062; F16J 15/024; H04R 1/44; H04R 1/023; H04R 2499/11
USPC ........ 174/50, 17 R, 17 CT, 650, 152 G, 135, 174/153 G, 152 R, 50.51, 520; 277/590, 277/596, 602, 644, 645, 647
See application file for complete search history.

(56) References Cited

U.S. PATENT DOCUMENTS 4,071,040 A * 1/1978 Moriarty ................. H04M 1/03
174/16.1
6,144,522 A * 11/2000 Myokan ............. G11B 33/1486
360/97.16

(Continued)

*Primary Examiner* — Angel R Estrada
(74) *Attorney, Agent, or Firm* — Downey Brand LLP

(57) ABSTRACT

An electronic device having an assembly is disclosed. The assembly is designed to regulate fluid flow into the electronic device. The assembly may include a membrane having air-permeable and liquid-resistant properties. In other to protect the membrane, the assembly includes a support member and a compressible membrane. Also, the assembly may further include a first housing member and a second housing member that combine to surround the membrane. Each feature of the assembly may include an opening to allow air to pass the assembly. When disposed in an opening of the electronic device, the assembly allows the device to receive air that is used by an operational component in the electronic device. The assembly protects the operational component from liquid ingress while allowing the operational component to communicate with the environment external to the device. The operation component may include a microphone, an audio speaker, or a pressure sensor.

20 Claims, 8 Drawing Sheets

(56) References Cited

U.S. PATENT DOCUMENTS

| | | | |
|---|---|---|---|
| 6,506,110 B1* | 1/2003 | Borisch | H05K 5/0213 174/17 VA |
| 7,166,024 B2* | 1/2007 | Mashiko | H05K 5/0213 454/270 |
| 7,189,918 B2* | 3/2007 | Sakata | H05K 5/0213 174/17 VA |
| 8,821,226 B2* | 9/2014 | Yano | H05K 5/0213 454/143 |
| 9,121,626 B2* | 9/2015 | Uemura | H05K 5/0213 |
| 9,295,949 B2* | 3/2016 | Uemura | H05K 5/0213 |

* cited by examiner

ACOUSTIC PORT WITH AN EMBEDDED MEMBRANE

CROSS-REFERENCE TO RELATED APPLICATION(S)

This application claims the benefit of priority under 35 U.S.C. §119(e) to U.S. Provisional Application No. 62/277,454, filed on Jan. 11, 2016, and titled "ACOUSTIC PORT WITH AN EMBEDDED MEMBRANE," the disclosure of which is incorporated herein by reference in its entirety.

FIELD

The following embodiments relate to an electronic device. In particular, the following embodiments relate to opening, or port, of the electronic device that that includes a seal. The seal is designed to allow air to pass through the opening and into or out of the electronic device, but prevent liquids from passing through the opening.

BACKGROUND

In order to form an electronic device having a waterproof opening, a seal may be directly secured to the waterproof opening. However, in some cases, the seal is formed from a delicate material that is prone to damage or deformation during manufacture of the electronic device. As a result, the seal may fail during reliability testing of the electronic device, or during use by a user of the electronic device, causing water to flow into the electronic device. This may lead to damage of one or more internal components of the electronic device.

In addition, a damaged or deformed seal may reduce the performance of the electronic device. For example, a seal mounted to an enclosure opening may be designed to prevent water passage to a microphone. However, the seal, even when deformed, may distort or block sound passing through the enclosure opening such that the microphone cannot properly covert acoustical energy into an audio signal.

SUMMARY

In one aspect, an assembly used to prevent liquid ingress is described. The assembly may include an assembly enclosure having an opening. The assembly may further include a membrane carrier carried by the assembly enclosure. The membrane carrier may include a membrane that 1) allows passage of air received from the opening, and 2) prevents passage of liquid received from the opening. The assembly may further include a support member disposed against the membrane carrier. The assembly may further include a compressible material disposed against the support member. Also, in some embodiments, the compressible material and the support member provide a counterforce to the membrane carrier and the membrane against a force from the liquid ingress.

In another aspect, an electronic device is described. The electronic device may include an enclosure defining an interior volume. The enclosure may include a through hole that opens to the interior volume. The electronic device may further include an assembly disposed in the interior volume. The assembly may include an assembly enclosure positioned between the through hole and the interior volume. The assembly may further include a membrane disposed in the assembly enclosure. The membrane can be configured to allow air received from the through hole to pass to the interior volume. The assembly may further include an operational component disposed in the interior volume that receives the air passing through the assembly. In some embodiments, the membrane is configured to prevent liquid ingress received from the through hole from passing to the interior volume.

In another aspect, a method for forming a liquid-resistant assembly for preventing liquid ingress into an electronic device is described. The method may include disposing a membrane carrier between a first housing member having a first opening and a second housing member having a second opening. The membrane carrier may include a membrane having a material that blocks liquid from passing through the material. The method may further include engaging the membrane carrier with a support member that supports the membrane. The method may further include bonding the first housing member with the second housing member. In some embodiments, the membrane allows air to pass from the first opening to the second opening.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
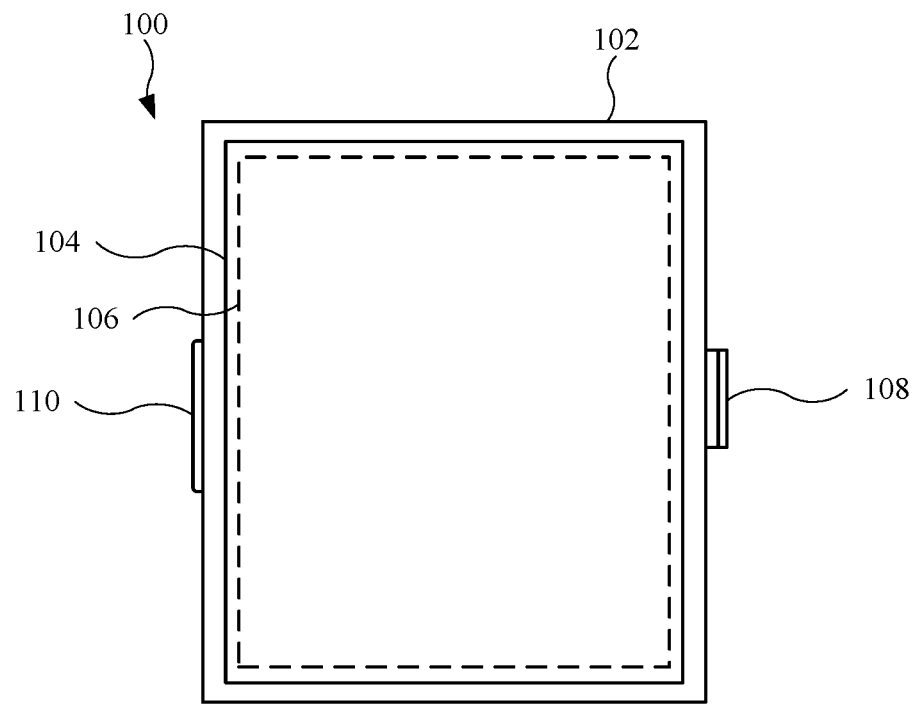
FIG. 1 illustrates a front view of an embodiment of an electronic device, in accordance with the descried embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with some described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a membrane in an electronic device. The membrane may be designed to regulate fluid flow through the electronic device. For example, the membrane may allow air to pass from an opening of the electronic device and into an interior region, or interior volume, of the electronic device. However, the membrane may prevent liquid ingress (such as water ingress) that enters the opening from further extending into the interior region. Accordingly, the membrane may allow internal components (in the interior volume) to receive air while also shielding the internal components from liquid ingress. Further, the membrane may also allow air to pass out of the opening of the electronic device.

In some cases, the membrane may include polytetrafluoroethylene ("PTFE"). Further, in some cases, the membrane includes a stretched PTFE, causing the membrane to include small pores of varying sizes. The electronic device, having an air-permeable, liquid-resistant membrane, may include an operational component that relies on the opening for air transmission while also being protected from liquid ingress via the membrane. For example, the operational component may include a microphone capable of receiving acoustical energy (transferred by the air) passing through the opening and the membrane, wherein the microphone may convert the acoustical energy into an audio signal (or signals). However, the operational component may include other components, such as an audio driver (audio speaker) or a barometric (pressure) sensor, both of which may rely upon the air transmission.

In some cases, the membrane may be relatively delicate, and accordingly, conducive to damage or deformation. For example, during an assembly or sub-assembly of an electronic device, a structural feature in the electronic device may contact the membrane and cause the damage or deformation. This, in turn, may block or distort the air transmission into or out of the electronic device. However, in the embodiments described herein, the membrane may be integrated with, or embedded in, an assembly designed to provide a protective enclosure for the membrane. Further, the assembly may facilitate the manufacture of the electronic device. For example, the assembly may be included in a pre-assembly operation that allows an operator to "drop," or easily insert, the assembly into an enclosure of the electronic device. Further, the assembly may promote automation of the pre-assembly operation as the likelihood of damage or deformation to the membrane is decreased.

In addition to improving assembly operations, the assembly may also improve quality control and testing. For example, a quality control test may be performed to quickly reveal liquid ingress associated with an assembly issue. Further, this quality control test may be performed prior to a final assembly manufacturing operation (or operations). This allows an assembly operator to fix (by an adjustment) or replace the assembly before several additional internal components are assembled in the enclosure. Also, the assembly may simplify the testing operation due in part to the ability to identify a location of an issue, if any, associated with the assembly.

In addition to the foregoing advantages, the assembly may provide further benefits. For instance, the membrane, when unsupported, may be subject to pressure or force from liquid ingress. Further, when the membrane is subjected to relatively higher pressures (for example, when the electronic device is submerged in liquid at greater depths), the membrane may be subject to additional pressure or force from the liquid. However, in the present embodiments, the membrane is integrated with a membrane carrier that provides support to the membrane. An outer edge of the membrane may be embedded in the membrane carrier by, for example, a molding operation that molds the membrane carrier while forming an opening for the membrane.

Also, a support member may be added to the assembly. The support member is designed to provide structural support to the membrane carrier and/or the membrane. In this regard, the support member may provide to the membrane a counterforce against the force created by liquid ingress. The support member may include a metal structure having one or more perforated openings to allow air to travel through the support member. Further, the assembly may include a compressible membrane having a foam material designed to provide additional structural support.

The assembly may also include a pair of housing members designed to enclose the components (such as the membrane, the membrane, the support member, and the compressible membrane). The first and second housing members may each include an opening to allow airflow through the housing members. However, when the membrane is located between the first and second housing member, the membrane is positioned to allow only the air to pass through the membrane and through the openings of the housing members, where the air may enter into an interior volume of the electronic device. Conversely, the membrane allows airflow through the assembly in the opposite direction, that is, out of the electronic device. Also, in order to form a liquid-resistant, sealed assembly, the first housing member may be welded with the second housing member. For example, an ultrasonic welding tool may be used to ultrasonically weld the first housing member with the second housing member, thereby preventing liquid ingress through an interface between the first and second housing members.

These and other embodiments are discussed below with reference to FIGS. 1-9. However, those skilled in the art will readily appreciate that the detailed description given herein with respect to these Figures is for explanatory purposes only and should not be construed as limiting.

FIG. 1 illustrates a front view of an embodiment of an electronic device 100, in accordance with some described embodiments. In some embodiments, the electronic device 100 is a tablet device. In other embodiments, the electronic device 100 is a mobile wireless communication device, such as a smartphone. In some embodiments, the electronic device 100 is a wearable electronic device, similar to a watch. In any of the foregoing embodiments, the electronic device 100 may include wireless communication capabilities. As shown, the electronic device 100 may include an enclosure 102. In some embodiments, the enclosure 102 is formed from a metal, which may include aluminum or stainless steel. In other embodiments, the enclosure 102 includes a metal alloy. Further, in some embodiments, the enclosure 102 includes a non-metal, such as ceramic.

The electronic device 100 may further include a protective layer 104 secured with the enclosure 102. The protective layer 104 may overlay a display assembly 106 (shown as a dotted line) designed to present visual content. In some embodiments, the protective layer 104 includes glass. In other embodiments, the protective layer 104 includes sapphire. The protective layer 104 may generally include any material that provides a protective and transparent cover for the display assembly 106. Also, the display assembly 106 may include a touch-sensitive display designed to respond to a capacitive coupling with a touch-sensitive layer (not shown) of the display assembly 106.

Also, the electronic device 100 may include one or more input features, such as a first input feature 108 and a second input feature 110. The first input feature 108 and/or the second input feature 110 may include a dial designed to rotate in response to a rotational force. The first input feature 108 and/or the second input feature 110 may include a button designed to actuate in a direction toward the enclosure 102 in response to a force. The first input feature 108 and/or the second input feature 110 may be used to generate an input to or command to a processor circuit (not shown) in the electronic device 100. In response to the input or command, the processor circuit may use an executable program stored on a memory circuit (not shown) to change the visual content displayed on the display assembly 106. Also, the electronic device 100 may include one or more radio circuits (not shown) allowing the electronic device 100 to connect to a network as well as pair with an additional electronic device, such as a wireless communication device.

Also, although not shown, when the electronic device 100 is a wearable electronic device, the electronic device 100 may include one or more bands that wrap around an appendage (a wrist, for example) of a user. Also, the enclosure 102 may include cavities or partial openings to receive and mechanically interlock with the bands, with the cavities allowing for the removal and replacement of the bands with different bands.

Figure 2:
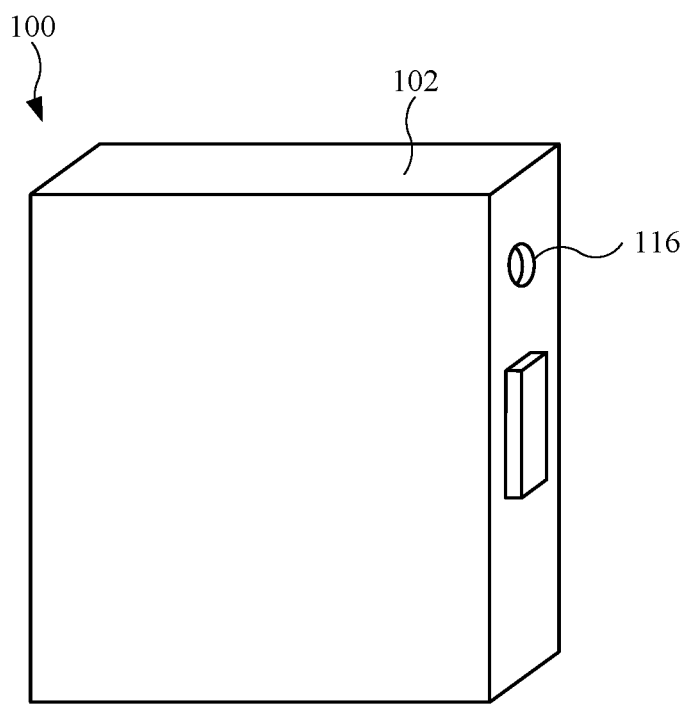
FIG. 2 illustrates a rear isometric view of the electronic device shown in FIG. 1.

FIG. 2 illustrates a rear isometric view of the electronic device shown in FIG. 1, showing an opening 116 in the enclosure 102. The opening 116 may be used by an operational component (not shown) in the electronic device 100. For example, the opening 116 may allow acoustical energy (or sound) outside the electronic device 100 to enter the electronic device via the opening 116, such that a microphone (not shown) in the electronic device 100 may use the acoustical energy to generate an audio signal (or signals). The electronic device 100 may include other operational components, such as an audio driver (or audio speaker) and/or a barometric (pressure) sensor. In this regard, the enclosure 102 may include additional openings (not shown). Further, the openings may be disposed along various locations of the enclosure 102 based in part on a location of the operational components. Also, the openings may vary in size and shape. Further, the number of openings may vary according to the functionality of the electronic device 100. For example, an additional opening (not shown) may be used in conjunction with the opening 116 to enhance the audible sound from an audio driver in the electronic device 100.

In some embodiments, the opening 116 (or an additional opening) is used as a vent for the electronic device 100 to allow air to flow into and/or out of the electronic device 100. For example, the electronic device 100 may be subject to an elevation change, such as an elevation increase or decrease. This may allow the electronic device 100 to respond to pressure changes by allowing the pressure inside the electronic device 100 to adjust and equilibrate with ambient pressure (outside the electronic device 100), which may prevent damage to the electronic device 100. Further, the electronic device 100 may include a barometric sensor that uses the opening 116 (or an additional opening) to detect pressure exerted on the electronic device 100.

Figure 3:
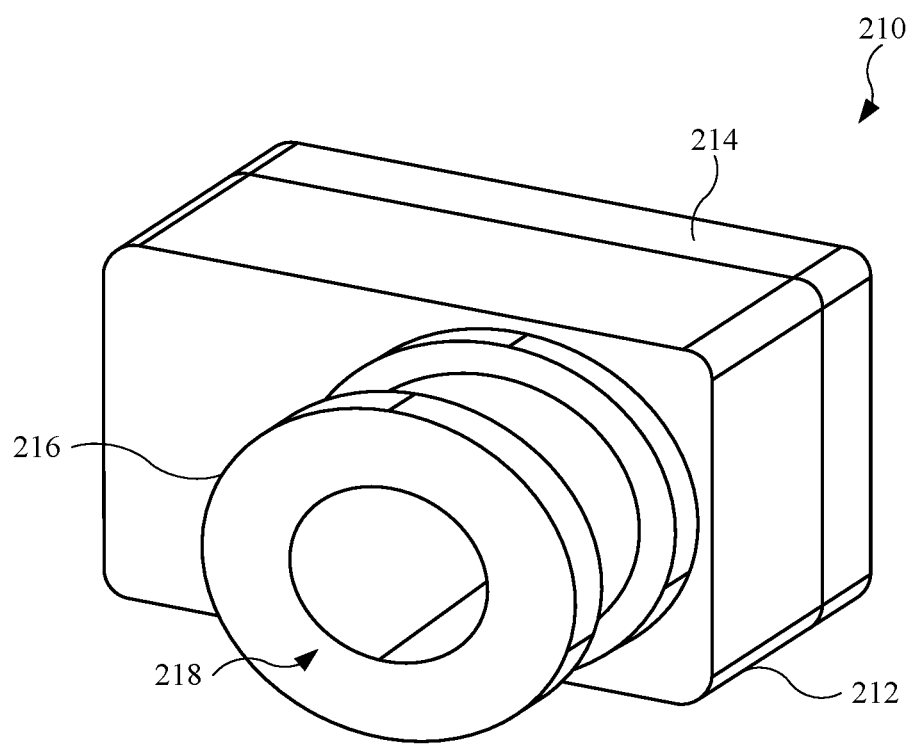
FIG. 3 illustrates an isometric view of an embodiment of an assembly, in accordance with some described embodiments.

While it may be desirable to allow the intake or outflow of air, it may be undesirable to allow liquid (such as water) to enter the electronic device 100 through the opening 116. In this regard, FIG. 3 illustrates an isometric view of an embodiment of an assembly 210, in accordance with some described embodiments. The assembly 210 may be disposed in the electronic device 100 (shown in FIGS. 1 and 2), and in particular, proximate to the opening 116 (shown in FIG. 2). The assembly 210 may include a first housing member 212 engaged with a second housing member 214. The first housing member 212 may combine with the second housing member 214 to define an assembly enclosure of the assembly 210 to enclose several features. In some embodiments, the first housing member 212 is mechanically coupled with the second housing member 214. In the embodiment shown in FIG. 3, the first housing member 212 is welded with the second housing member 214. The welding operation may include ultrasonically welding the first housing member 212 with the second housing member 214 to define an ultrasonically welded seal at an interface between the first housing member 212 and the second housing member 214. As shown, the first housing member 212 and the second housing member 214 are generally rectangular in shape. However, other shapes of the first housing member 212 and the second housing member 214 are possible, and may be utilized to accommodate the location of other components in an electronic device. For example, in other embodiments, the first housing member 212 and the second housing member 214 include three-sided structures. The first housing member 212 and the second housing member 214 may also include five or more sides. Also, the first housing member 212 and the second housing member 214 may be formed by a molding operation, including injection molding or compression molding, as non-limiting examples. In this regard, the first housing member 212 and the second housing member 214 may be formed from a polymeric material (or materials), such as plastic.

As shown, the first housing member 212 may include an extension 216. The extension 216 may be designed to enter an opening, including a recessed opening, of an enclosure (not shown) of an electronic device. The extension 216 is generally cylindrical, and may include a size and shape corresponding to a size and a shape of the recessed opening previously described, such that the extension 216 at least partially fits within the recessed opening. For example, the size and the shape of the extension 216 may correspond to a size and shape of recess (not shown) formed with the enclosure 102 (shown in FIG. 2) that opens to the opening 116 (shown in FIG. 2). This will be shown below. Also, the extension 216 is generally off-center with respect to the first housing member 212. However, the extension 216 may generally be located in any region, including a central region, of the first housing member 212. Also, although not shown, the extension 216 may include a compressible ring (such as an O-ring) formed from a compressible material, such as rubber or elastomer. The compressible ring may provide a seal against liquid ingress when fitted in and engaged with an opening. This will be shown below. Also, the first housing member 212 may include a first opening 218 that passes through the first housing member 212 and the extension 216. This may allow fluids to enter the assembly 210. However, the assembly 210 may be designed to allow only air, as opposed to liquids, to pass completely through the assembly 210 by way of the first opening 218 and a second opening (not shown) of the assembly 210 located in the second housing member 214. In this regard, the assembly 210 may carry several structural features. For example, the assembly 210 may include a membrane (not shown) enclosed by the first housing member 212 and the second housing member 214. The membrane, along with several other features not shown, will be shown and described below.

Figure 4:
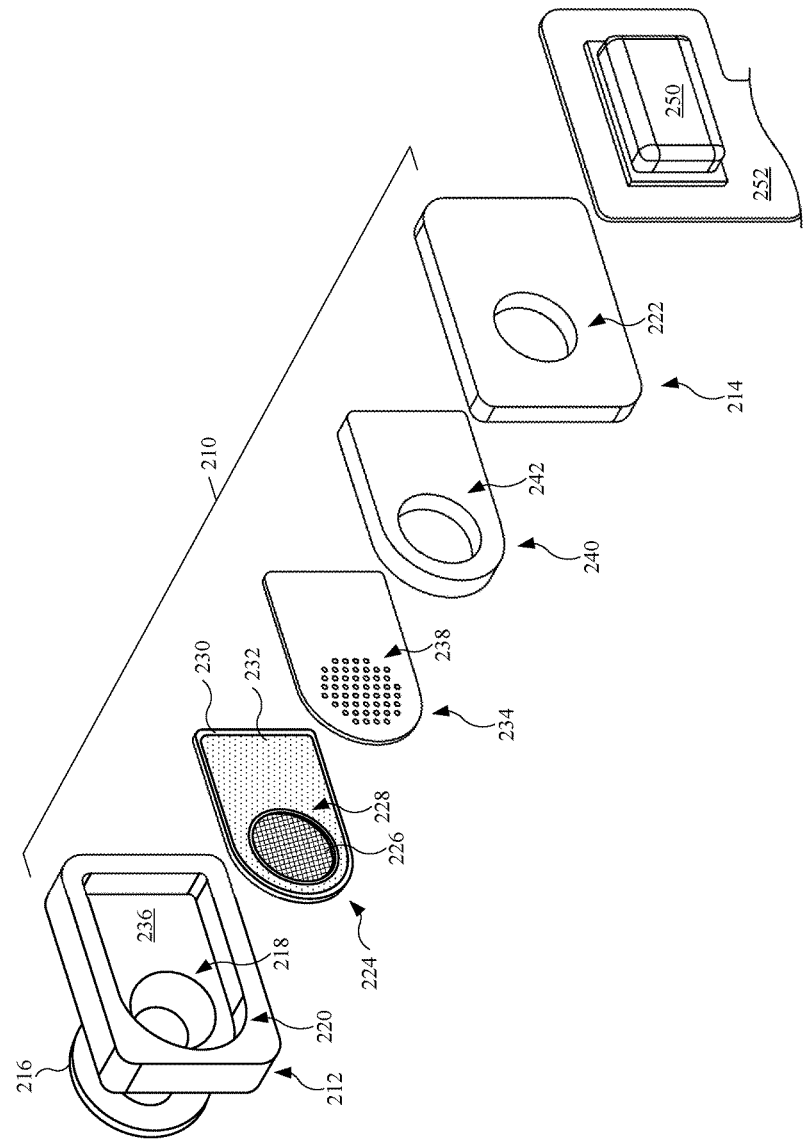
FIG. 4 illustrates an exploded view of the assembly shown in FIG. 3, in accordance with some described embodiments.

FIG. 4 illustrates an exploded view of the assembly 210 shown in FIG. 3, in accordance with some described embodiments. As previously described, the assembly 210 may include a first housing member 212 and a second housing member 214. As shown, the first opening 218 of the extension 216 may open to an interior region of the first housing member 212, defined by a compartment 220 of the first housing member 212. Also, the second housing member 214 may include a second opening 222. The second opening 222 may open to the interior volume 120 (shown below) of an electronic device, thereby allowing air that passes through the first opening 218 to also pass to the second opening 222.

The compartment 220 is designed to receive several structural component. For example, the compartment 220 may receive a membrane carrier 224. The membrane carrier 224 may include a membrane 226 positioned in an opening 228 of the membrane carrier 224. In some embodiments, the membrane 226 may include a polytetrafluoroethylene ("PTFE") membrane. Further, in some embodiments, the membrane 226 includes a stretched PTFE membrane. Generally, the membrane 226 may include any material or materials designed to prevent liquid (such as water) flow through the membrane 226 while also allowing airflow through the membrane 226. In this regard, the membrane 226 may be referred to as an air-permeable, liquid-resistant membrane. Also, the membrane 226, or a portion thereof, may be embedded in, or integrated with, the membrane carrier 224.

In some embodiments, the membrane carrier 224 includes a first surface 230 having a first adhesive layer 232. The first adhesive layer 232 may include a pressure sensitive adhesive, an epoxy, or the like. The first adhesive layer 232 may allow the membrane carrier 224 to bond with a support member 234 (discussed below) along the first surface 230 of the membrane carrier 224. Also, the membrane carrier 224 may include a second surface (not shown) opposite the first surface 230 and having a second adhesive layer (not shown). The second surface and the second adhesive layer may include any size, shape, or membrane previously described for the first surface 230 and the first adhesive layer 232, respectively. The second adhesive layer may allow the membrane carrier 224 to bond with an internal surface 236 of the first housing member 212.

The assembly 210 may further include a support member 234 designed to provide structural support to the membrane carrier 224 and/or the membrane 226. In this regard, the support member 234 may define a stiffening mechanism that provides a counterforce to the membrane carrier 224 and/or membrane 226 against a force to the membrane carrier 224 and/or membrane 226 exerted by a liquid, for example, in order to prevent damage or deformation to the membrane 226. In some embodiments, the support member 234 includes a metal or metal alloy. Further, in some embodiments, the support member 234 is formed from stainless steel, such as SS 304. Further, in some embodiments, the support member 234 includes a thickness of less than 1 millimeter ("mm"), and may include a thickness of less than 0.5 mm. Also, in order to allow air to pass through the support member 234, the support member 234 may include openings 238 formed from a perforating or piercing operation to the support member 234. However, in some embodiments (not shown), the support member 234 includes a single opening to allow air to pass.

The assembly 210 may further include a compressible membrane 240 positioned in the compartment 220. In some embodiments, the compressible membrane 240 includes compressible foam. Also, due in part to its compressible nature, the compressible membrane 240 may condense when, for example, the compressible membrane 240 receives a force from the support member 234 and/or the second housing member 214. The condensing of the compressible membrane 240 may allow for variances in thicknesses of the membrane carrier 224, the support member 234, and/or the interior volume defined by the compartment 220, where the varying thicknesses of the structural features may be due in part to variances in tolerances during manufacturing of each component. Further, the compressible membrane 240 may provide a counterforce to the support member 234, as well as the membrane carrier 224 and the membrane 226, against a force or forces acting on the support member 234 (and/or the membrane carrier 224 and the membrane 226). Also, it should be noted that the compartment 220 may include a shape that corresponds to a shape of the membrane carrier 224, the support member 234, and the compressible membrane 240, allowing these features to fit into the compartment 220.

Also, as shown in FIG. 4, the compressible membrane 240 may include an opening 242 designed to allow air to pass through the compressible membrane 240 at the opening 242. Accordingly, the assembly 210 may allow air to pass through the openings of the various features of the assembly 210. However, the membrane 226 in the membrane carrier 224 may prevent liquid that enters the first opening 218 from further passage through the assembly 210, and in particular, prevent liquid passage through the second opening 222. In some embodiments (not shown), the compressible membrane 240 includes several small openings, or micro-openings, that allow airflow through the compressible membrane 240, and the opening 242 is removed.

When assembled in an opening of an electronic device, the assembly 210 may allow air to pass from the environment to the opening and an into an interior volume of the electronic device, thereby allowing an operational component 250 to use the airflow. For example, in some embodiments, the operational component 250 is a microphone that receives acoustical energy that passes through the assembly 210, allowing the microphone to convert the acoustical energy into an audio signal (or signals). Due in part to the membrane 226, the operational component 250, when positioned on or near the second housing member 214, may be protected from any liquid ingress entering the assembly 210. As shown in FIG. 4, the operational component 250 may be electrically coupled with a circuit 252, which may include a flexible circuit that includes an opening (not shown) that opens to the second opening 222. The circuit 252 may electrically couple the operational component 250 with a circuit board (not shown) and/or one or more processor circuits (not shown) that process the electrical signal (or signals) from the operational component 250. The operational component 250 is not limited to a microphone. For example, in some embodiments (not shown), the operational component 250 is an audio driver designed to emit audible sound that may pass through the assembly 210 and out of an electronic device. In some embodiments (not shown), the operational component 250 is a pressure sensor (or barometric sensor) designed to detect pressure exerted on an electronic device, due to airflow into or out of the assembly 210.

The features, including the first housing member 212, the second housing member 214, support member 234 and the compressible membrane 240, may combine to support the membrane 226 not only during use of an electronic device (not shown) that carries the assembly 210, but also during manufacture of the electronic device, as these feature surround the membrane 226. As a result, the membrane 226 is less susceptible to damage or deformation thereby increasing the likelihood of liquid ingress prevention of the membrane 226. Also, when the membrane 226 is prevented from damage or deformation, the membrane 226 may permit airflow to maintain a desired acoustical performance of the operational component 250. In this manner, the membrane 226 is less likely to block or distort air transmission, acoustical energy, or audible sound. Also, while a particular configuration is shown, other configurations are possible. For example, the second housing member 214 may include a compartment similar to the compartment 220 to receive one or more internal components. In this regard, the compartment 220 in the first housing member 212 may include a reduced volume, or alternatively, the compartment 220 may be removed.

Figure 5:
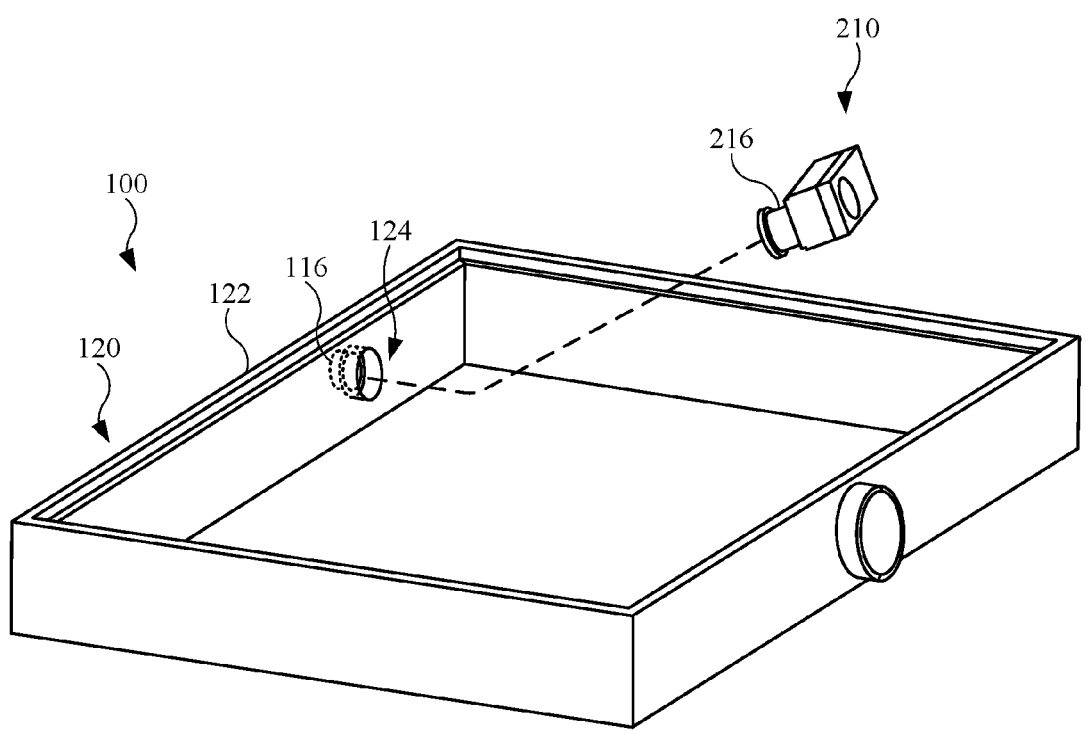
FIG. 5 illustrates an isometric view of the electronic device shown in FIG. 1, showing an interior volume of the housing, and further showing the assembly prior to assembling with the housing.

FIG. 5 illustrates an isometric view of the electronic device 100 shown in FIG. 1, showing an interior volume 120 of the enclosure 102, and further showing the assembly 210 prior to assembling with the enclosure 102. For purposes of simplicity and illustration, the protective layer 104 and the display assembly 106 (both shown in FIG. 1), along with several internal components (processors, memory, circuit assemblies, battery, etc.) are removed. As shown in FIG. 5, the opening 116 may be located on a sidewall 122 of the enclosure 102. In addition to the opening 116, the sidewall 122 may include a recess 124, or recessed opening, surrounding the opening 116. The opening 116 and the recess 124 may combine to form a through hole passing through the sidewall 122, with the through hole provide a pathway for ambient air, external with respect to the electronic device 100, into the interior volume 120.

Figure 6:
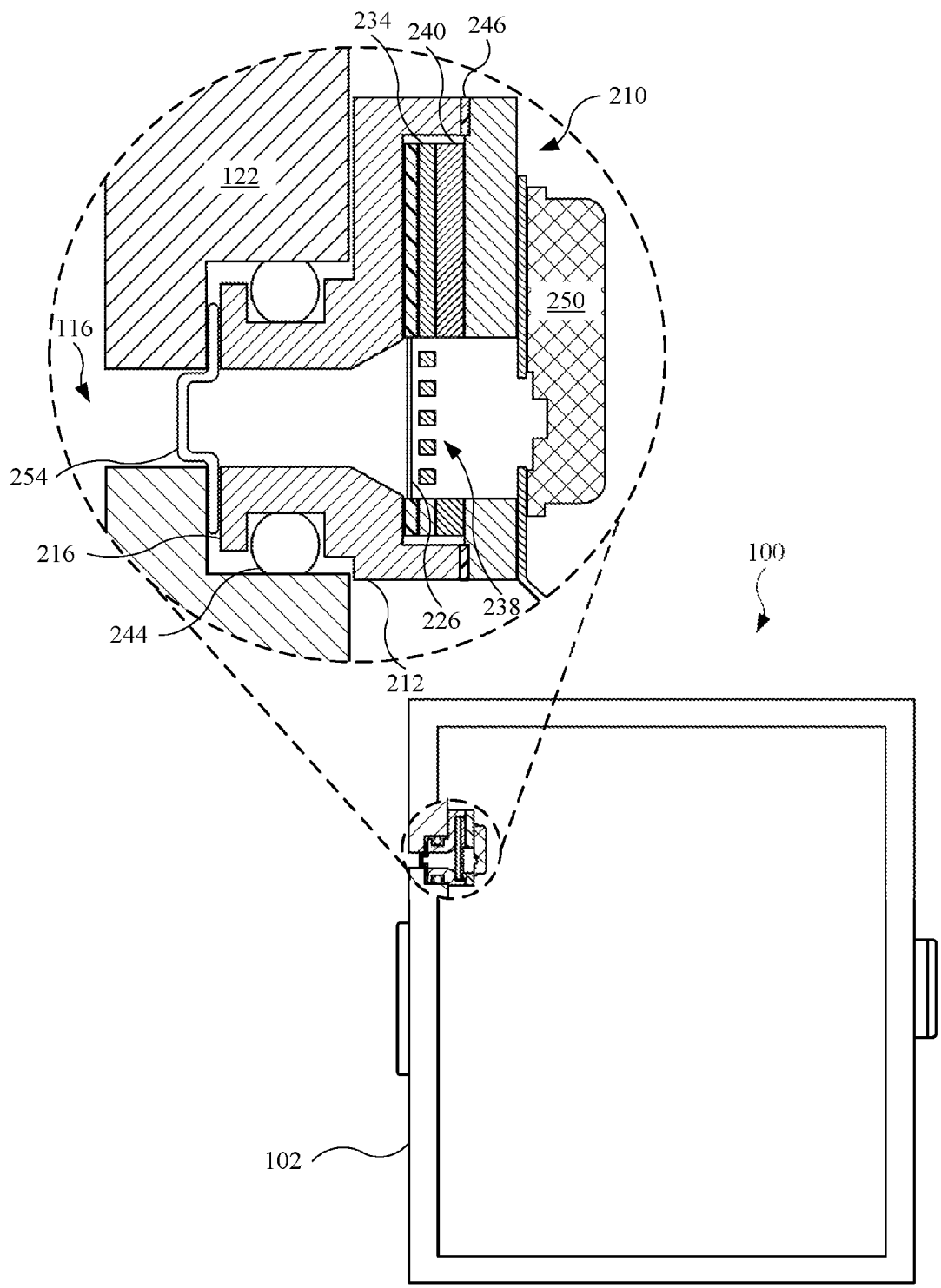
FIG. 6 illustrates a partial cross sectional of the electronic device shown in FIG. 1, showing the assembly positioned in the electronic device.

FIG. 6 illustrates a partial cross sectional of the electronic device 100 shown in FIG. 1, showing the assembly 210 positioned in the electronic device 100. As shown in the enlarged view, the assembly 210 may be at least partially disposed in the enclosure 102. For example, the first housing member 212 and/or the extension 216 may be positioned in the recess 124 (not labeled, but shown in FIG. 5) of the sidewall 122. Further, the extension 216 may include a compressible ring 244 positioned around the extension 216 and engaged with the sidewall 122 at the recess 124. The compressible ring 244 may secure the assembly 210 in the sidewall 122 as well as provide a barrier to liquid that may pass around the assembly 210.

Also, as shown in FIG. 6, the membrane 226 may prevent liquid that enters the opening 116 from further passing into the electronic device 100. Also, as the liquid may exert pressure on the membrane 226, the support member 234 may provide a counterforce to support the membrane 226, while the openings 238 of the support member 234 permit airflow through the support member 234. Further, the compressible membrane 240, shown in a condensed state, may provide additional support to the membrane 226 in the form of a counterforce. This may allow the membrane 226 to withstand pressure exerted on the membrane 226 by liquids. Also, in this configuration, the assembly 210 may allow air, but not liquid, to reach the operational component 250 located inside the electronic device 100 and secured with the assembly 210 (in this configuration). Also, the first housing member 212 may be joined with the second housing member 214 by a seal 246, such as an ultrasonic seal. The seal 246 may extend around an entire interface region between the first housing member 212 and the second housing member 214. Also, an acoustic mesh 254, which may be at least partially positioned in the opening 116, may hide the assembly 210.

Figure 7:
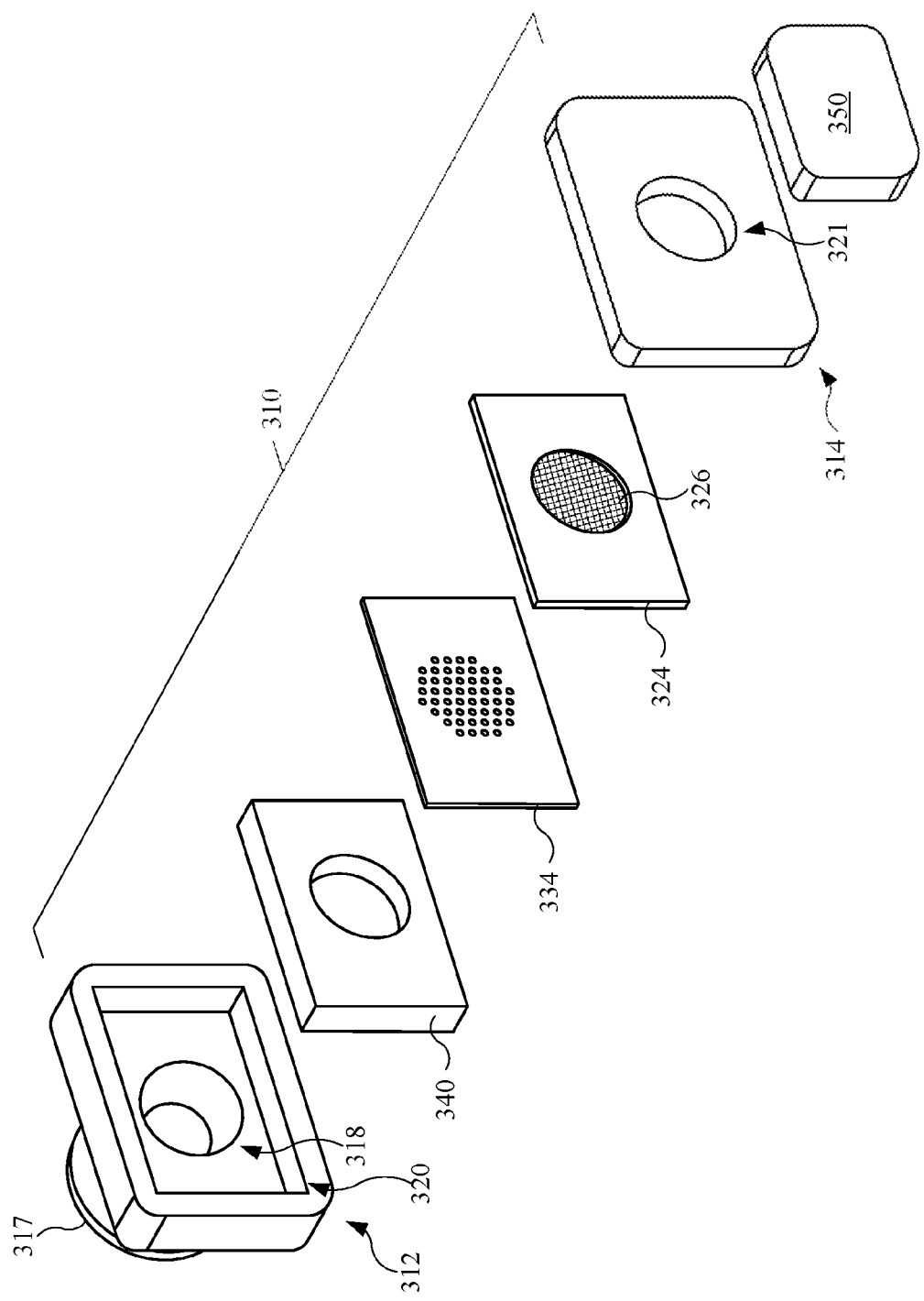
FIG. 7 illustrates an exploded view of an alternate embodiment of an assembly, in accordance with some described embodiments.

FIG. 7 illustrates an exploded view of an alternate embodiment of an assembly 310, in accordance with some described embodiments. The assembly 310 may include any feature or features previously described for an assembly. However, the assembly 310 shown in FIG. 7 may include several differences. For example, the assembly 310 may include a first housing member 312 and a second housing member 314 having a first opening 318 and a second opening 321, respectively, with the aforementioned openings located in a central region their respective housing members. Also, the first housing member 312 may include an extension 317 located in a central region of the first housing member 312. In addition, the internal structural components may be ordered differently as compared to previous embodiments. For example, as shown in FIG. 7, the assembly 310 may include a compressible membrane 340 and a support member 334 positioned between the first housing member 312 and a membrane carrier 324 that includes a membrane 326, with the membrane 326 designed as an air-permeable and liquid-resistant membrane. In this manner, the membrane carrier 324 and the membrane 326 may be closer in proximately to an operational component 350 as compared to previous embodiments, and location of the membrane 326 may lead to an improved acoustical performance of the operational component 350.

Also, as opposed to having rounded, or semi-circular, edges, the internal structural components of the assembly 310 may include a four-sided shape. In this regard, a compartment 320 of the first housing member 312 may include a corresponding shape to receive at least some of the internal structural components. Also, although not shown, the membrane carrier 324 may include adhesive layers on opposing surfaces to allow the membrane carrier 324 to adhesively secure with the support member 334 and the second housing member 314. Also, the operational component 350 shown in FIG. 7 may include an audio driver. However, the operational component 350 may include a microphone or a pressure sensor.

Figure 8:
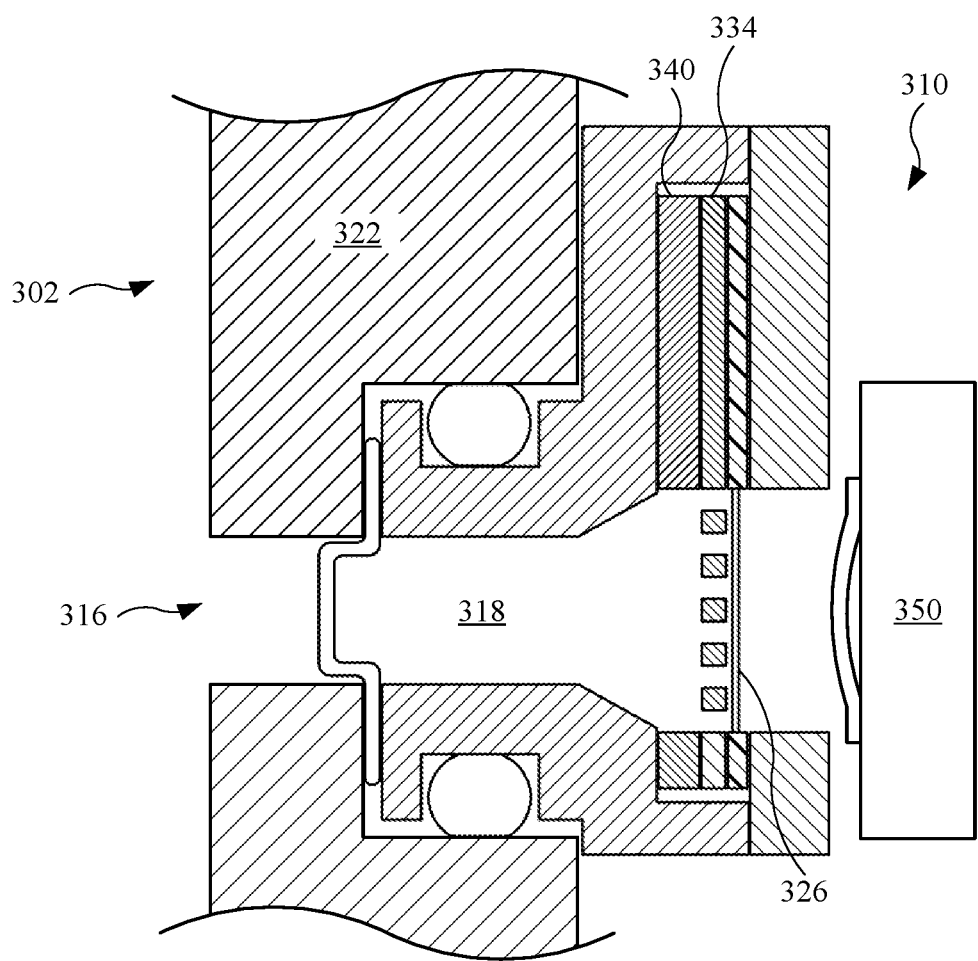
FIG. 8 illustrates a cross sectional view of the assembly shown in FIG. 7, showing the assembly inserted into a sidewall of an enclosure of an electronic device.

FIG. 8 illustrates a cross sectional view of the assembly 310 shown in FIG. 7, showing the assembly 310 inserted into a sidewall 322 of an enclosure 302 of an electronic device. A partial view of the enclosure 302 of an electronic device is shown. However, the enclosure 302 may be substantially similar to the enclosure 102 (shown FIG. 6). As shown, the membrane carrier 324 and the membrane 326 may be closer in proximity to the operational component 350, while still receiving support from the support member 334 and the compressible membrane 340. In particular, the support member 334 may block some of the liquid flow that may pass through an opening 316 of the sidewall 322 and through the first opening 318 of the assembly 310.

Figure 9:
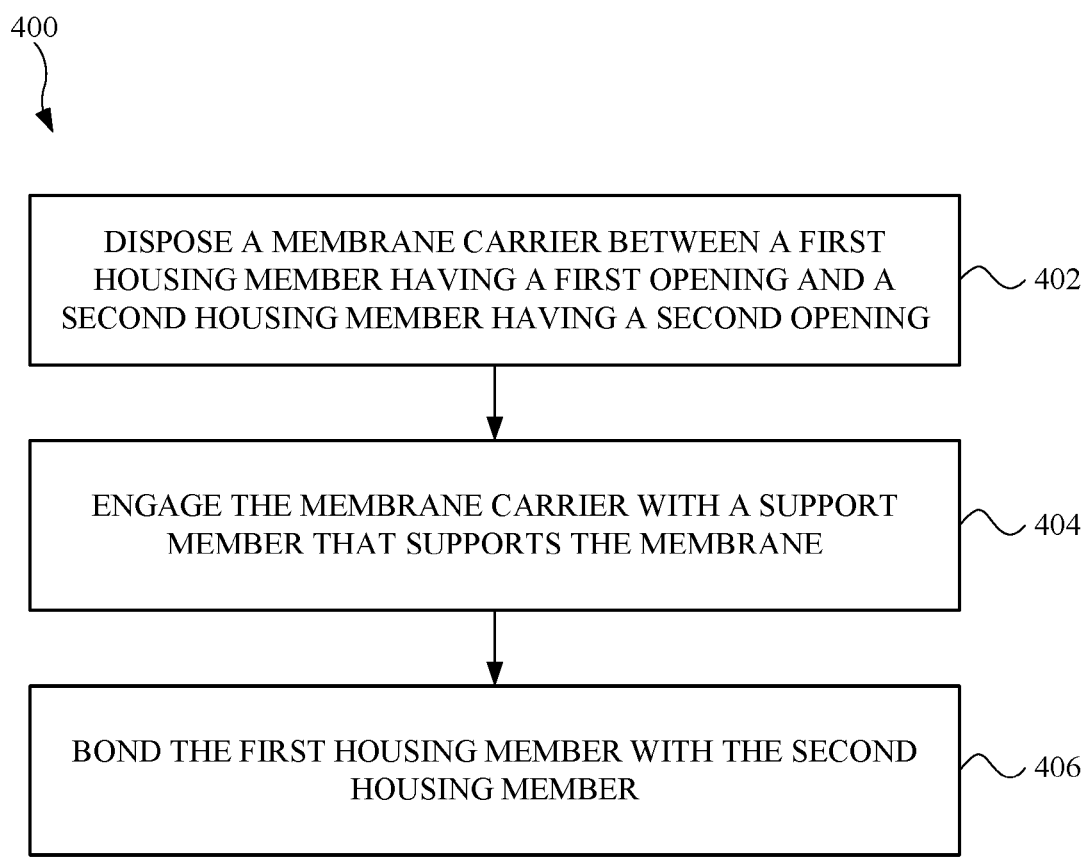
FIG. 9 illustrates a flowchart showing a method for forming a liquid-resistant assembly for preventing liquid ingress into an electronic device, in accordance with some described embodiments.

FIG. 9 illustrates a flowchart 400 showing a method for forming a liquid-resistant assembly for preventing liquid ingress into an electronic device, in accordance with some described embodiments. In step 402, a membrane carrier is disposed between a first housing member having a first opening and a second housing member having a second opening. The membrane carrier may include a membrane having a material that blocks liquid from passing through the material. The material may include PTFE, or some other material designed to allow airflow through the metal, but prevent liquid from passing through the material. Also, the first housing member and the second housing member may each be formed by a molding operation. The molding operation may include a mold cavities that receive a polymeric material to mold the first and second housing members.

In step 404, the membrane carrier engages with a support member that supports the membrane. The support member may include a perforated element that provides structural support to the membrane. For example, if water enters the liquid-resistant assembly, the support member can provide a counterforce to a force (or forces) acting on the membrane from the water. The support member may include a metal or metal alloy. Further, the support member can be formed from stainless steel, such as SS 304.

In step 406, the first housing member is bonded with the second housing member. The first housing member may bonding with the second housing member by an ultrasonic welding operation that welds together non-metal parts. The weld formed by the ultrasonic welding operation prevents liquid from entering an interface between the first housing member and the second housing member. Further, the membrane, the membrane carrier, and the support member may be positioned in a compartment. The compartment may include an interior volume in the first housing member. In some embodiments, a compressible membrane is also positioned in the compartment. Also, the membrane can be positioned between the first and second housing members such that the membrane allows air to pass from the first opening to the second opening, and vice versa. Also, the membrane can prevent liquid from passing through from the first opening to the second opening.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An assembly used to limit liquid ingress, the assembly comprising:
   an assembly enclosure that forms an internal volume, the assembly enclosure having an opening;
   a membrane carrier positioned in the assembly enclosure, the membrane carrier comprising a membrane that 1) allows passage of air received from the opening, and 2) prevents passage of liquid received from the opening;
   a support member positioned in the internal volume and disposed against the membrane carrier; and
   a compressible material positioned in the internal volume and against the support member, wherein the compressible material and the support member provide a counterforce to the membrane carrier and the membrane against a force from the liquid ingress.

2. The assembly of claim 1, wherein the assembly enclosure comprises:
   a first housing member comprising a compartment; and
   a second housing member bonded with the first housing member to enclose the membrane, the membrane, the support member, and the compressible material in the compartment.

3. The assembly of claim 2, wherein:
   the first housing member includes the opening,
   the second housing member comprises a second opening, and
   the membrane allows only the air to pass through the opening to the second opening.

4. The assembly of claim 2, wherein the first housing member comprises an extension, and wherein the opening is formed through the extension and opens to the compartment.

5. The assembly of claim 2, wherein the first housing member is bonded with the second housing member by an ultrasonic seal.

6. The assembly of claim 2, wherein the membrane carrier comprises:
   a first surface comprising a first adhesive layer that bonds with the support member; and
   a second surface opposite the first surface, the second surface comprising a second adhesive layer that bonds with the first housing member.

7. The assembly of claim 1, wherein the membrane comprises a polytetrafluoroethylene material.

8. A wearable electronic device, comprising:
   an enclosure defining an interior volume, the enclosure comprising a through hole that opens to the interior volume;
   a protective layer that secures with the enclosure and encloses the interior volume;
   a display assembly covered by the protective layer;
   an assembly disposed in the interior volume, the assembly comprising:
      an assembly enclosure positioned between the through hole and the interior volume, and
      a membrane disposed in the assembly enclosure, the membrane configured to allow air received from the through hole to pass to the interior volume; and
   an operational component disposed in the interior volume that receives the air passing through the assembly, wherein the membrane is configured to prevent liquid ingress received from the through hole from passing to the interior volume.

9. The electronic device of claim 8, wherein the assembly further comprises:
   a membrane carrier that holds the membrane; and
   a support member disposed against the membrane to support the membrane and the membrane against a force from the liquid ingress.

10. The electronic device of claim 9, wherein the assembly further comprises a compressible material that supports the membrane and the support member against the force from the liquid ingress.

11. The electronic device of claim 8, wherein the through hole opens to a recess that faces the interior volume.

12. The electronic device of claim 11, wherein the assembly enclosure includes:
an extension positioned in the recess,
a first opening through the extension, and
a second opening that opens to the interior volume, wherein the air received from the through hole passes through the first opening, the membrane, and the second opening.

13. The electronic device of claim 8, wherein the membrane comprises a polytetrafluoroethylene membrane.

14. The electronic device of claim 8, further comprising a band secured with the enclosure and configured to secure the enclosure with an appendage of a user.

15. A method for forming a liquid-resistant assembly for preventing liquid ingress into an electronic device, the method comprising:
disposing a membrane carrier between a first housing member having a first opening and a second housing member having a second opening, wherein the membrane carrier comprises a membrane having a material that blocks liquid from passing through the material;
engaging the membrane carrier with a support member that supports the membrane; and
bonding the first housing member with the second housing member, wherein the membrane allows air to pass from the first opening to the second opening.

16. The method of claim 15, wherein bonding the first housing member with the second housing member comprises ultrasonically welding the first housing member with the second housing member.

17. The method of claim 15, further comprising disposing a compressible membrane between the first housing member and the second housing member, the compressible membrane providing a counterforce for the membrane against a force from the liquid ingress.

18. The method of claim 15, further comprising:
forming a compartment in the first housing member; and
positioning the membrane, the support member, and a portion of a compressible membrane in the compartment.

19. The method of claim 18, further comprising forming an extension on the first housing member, wherein the first opening extends through the extension and opens to the compartment.

20. The method of claim 15, further comprising:
molding the membrane carrier to the membrane; and
forming perforations in the support member in a location corresponding to the membrane.

* * * * *